United States Patent
Kusakabe

[11] Patent Number: 6,020,620
[45] Date of Patent: *Feb. 1, 2000

[54] SEMICONDUCTOR LIGHT-RECEIVING DEVICE WITH INCLINED MULTILAYER STRUCTURE

[75] Inventor: Atsuhiko Kusakabe, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/886,164

[22] Filed: Jun. 30, 1997

[30] Foreign Application Priority Data

Jun. 28, 1996 [JP] Japan .................................. 8-169736

[51] Int. Cl.$^7$ .............................................. H01L 31/0232
[52] U.S. Cl. ........................... 257/436; 257/458; 257/466
[58] Field of Search .................................... 257/436, 452, 257/458, 466, 189, 184, 188, 21

[56] References Cited

U.S. PATENT DOCUMENTS

| 4,438,447 | 3/1984 | Copeland, III et al. | 257/431 |
|---|---|---|---|
| 5,665,985 | 9/1997 | Iwata | 257/466 |

FOREIGN PATENT DOCUMENTS

| 2-33982 | 2/1990 | Japan . |
|---|---|---|
| 03035555 | 2/1991 | Japan . |
| 04268770 | 2/1991 | Japan . |
| 3-035555 | 2/1991 | Japan . |
| 3-35555 | 2/1991 | Japan . |
| 4-268770 | 9/1992 | Japan . |
| 6-268196 | 9/1994 | Japan . |
| 7-202263 | 8/1995 | Japan . |

OTHER PUBLICATIONS

Li et al., "Improved Performance of Strained InGaAs/GaAs Photodiodes Grown on Patterned GaAs Substrates by Molecular Beam Epitaxy", *Appl. Phys. Lett.*, vol. 58, No. 18, May 1991, pp. 1931–1933.

Miura et al., "Planar Embedded InP/GaInAs p–i–n Photodiode for Very High–Speed Operation", *Journal of Lightwave Technology*, LT–5, No. 10, Oct. 1987, pp. 1371–1376.

(List continued on next page.)

*Primary Examiner*—Minh Loan Tran
*Attorney, Agent, or Firm*—Young & Thompson

[57] ABSTRACT

A semiconductor light-receiving device including (a) a semiconductor substrate, (b) a multi-layered including a first buffer layer having a first electrical conductivity and lying on the semiconductor substrate, a first clad layer having a first electrical conductivity and lying on the first buffer layer, a light-absorbing layer having a first electrical conductivity and lying on the first clad layer, a second clad layer having a second electrical conductivity and lying on the light-absorbing layer, and a second buffer layer having a second electrical conductivity and lying on the second clad layer, (c) a first electrode formed on the second buffer layer, and (d) a second electrode formed on a lower surface of the semiconductor substrate. The multi-layered structure has at least one portion which is inclined to a direction in which a light introduced into the device is directed. For instance, the multi-layered structure has opposite end portions inclined to the direction. A portion of the multi-layered structure making inclination with the direction provides the same advantageous effect as that a light-receiving area of a light-receiving layer of the multi-layered structure is effectively increased. Thus, the semiconductor light-receiving device could be readily coupled to other devices through optical fibers. In addition, there can be obtained a high coupling efficiency which is greater than 90%. Furthermore, the semiconductor light-receiving device provides a high quantum efficiency which is greater than 90%, and enables to accomplish high-speed response at a speed greater than 20 Gbps.

25 Claims, 7 Drawing Sheets

OTHER PUBLICATIONS

Kato et al., "High–Efficiency Waveguide InGaAs pin Photodiode with Bandwidth of Over 40 GHz", *IEEE Photonics Technology Letters*, No. 5, May 1991, pp. 473–474.

W.Q. Li et al., "Improved performance of strained InGaAs/GaAs photodiodes grown on patterned GaAs substrates by molecular beam epitaxy", pp. 1931–1933, Applied Physics Letters, vol. 58, No. 18, May 6, 1991.

Kazutoshi Kato et al., "High–efficiency waveguide InGaAs pin photodiode with bandwidth of over 40 GHz", pp. 473–474, IEEE Photonics Technology Letters, vol. 3, No. 5, May 1, 1991.

S. Miura et al., "Planar embedded InP/GaInAs p–i–n photodiode for very high–speed operation", pp. 1371–1376, Journal of Lightwave Technology, vol. Lt5, No. 10, Oct. 1987.

Kato, K., et al., "High Efficiency, Waveguide InGaAs Pin Photodiode with Bandwidth of 40GHz", *Electronic Data Communication Association Spring Conference*, 1991, p. 4–200.

SEMICONDUCTOR LIGHT-RECEIVING DEVICE WITH INCLINED MULTILAYER STRUCTURE

BACKGROUND OF THE INVENTION

1. Field of the Invention

The invention relates to a semiconductor light-receiving device to be employed for optical communication and optical data processing, and a method of fabricating the same.

2. Description of the Related Art

A compound semiconductor light-receiving device has been put to practical use as a wide-range wavelength light receiver with high sensitivity for optical communication and optical data processing. Above all, a semiconductor light-receiving device for a wavelength of 1.3 μm or 1.55 μm, which is a wavelength for high capacity long-distance optical communication, is usually made of InGaAs.

It is necessary for a PIN photo diode made of InGaAs to minimize a junction capacity of individual devices in order to accomplish ultra-high speed response greater than 40 Gbps, and to form a light-absorbing layer thinner in order to reduce running time of carriers.

However, in a presently commercially available light-receiving device having a surface through which the device receives a light, if a light-receiving diameter is made smaller for reducing a junction capacity, optical coupling would be difficult to properly take place when the light-receiving device receives a light from an optical fiber, resulting in deterioration of coupling efficiency. On the other hand, if a light-receiving layer made of InGaAs were formed thinner, it would be possible to reduce running time of carriers, however, with the result of reduction in quantum efficiency. Thus, reduction in a junction capacity and enhancement in coupling efficiency, and reduction in carrier running time and enhancement in quantum efficiency are in a trade-off relationship. Hence, since a direction in which a light is directed is coaxial with a direction in which carriers run in either process, reduction in light-receiving sensitivity is unavoidable, even if high-speed response could be accomplished.

In order to avoid influence due to the above mentioned trade-off relationship, there has been suggested a waveguide type light-receiving device in which a direction in which a light runs is deflected by 90 degrees to a direction in which carriers run.

Figure 1:
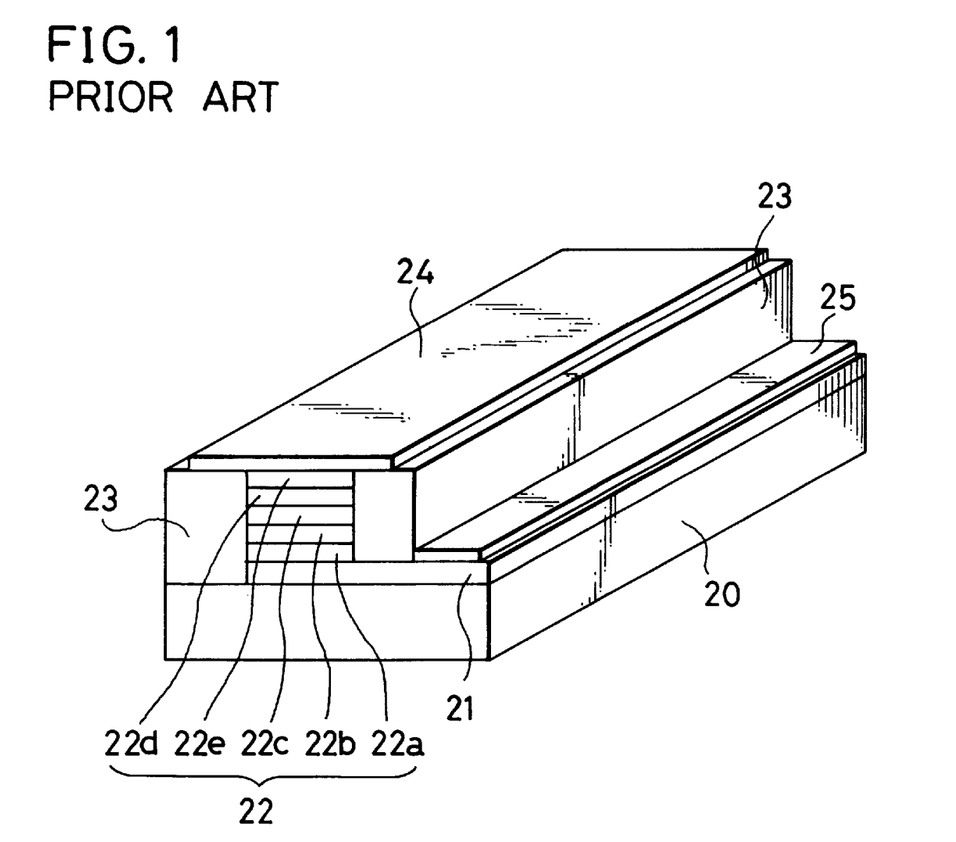
FIG. 1 is a perspective view illustrating a conventional semiconductor light-receiving device.

FIG. 1 illustrates one of conventional waveguide type light-receiving devices, which has been suggested by K. Kato et al. in "High efficiency, waveguide InGaAs pin photodiode with bandwidth of 40 GHz", Electronic Data Communication Association Spring Conference, 1991, pp. 4–200, C-183. The illustrated waveguide type light-receiving device includes a semi-insulating InP substrate 20, an insulating layer 21 formed on the substrate 20, a waveguide type light-receiving region 22 formed on the insulating layer 21, a pair of polyimide layers 23 sandwiching the light-receiving region 22 therebetween, a p-side electrode 24 formed over the light-receiving region 22 and the polyimide layers 23, and an n-side electrode 25 formed on the insulating layer 21. The waveguide type light-receiving region 22 acts as a waveguide, and is comprised of an n-InGaAsP clad layer 22a, an n-InGaAs light-absorbing layer 22b, a p-InGaAs light-receiving layer 22c, a p-InGaAsP clad layer 22d, and a p-InGaAsP contact layer 22e. The waveguide type light-receiving region 22 is formed by successive, epitaxial growth of these layers. The p-side electrode 24 makes electrical contact with the p-InGaAsP contact layer 22e, and the n-side electrode 25 makes electrical contact with the n-InGaAsP clad layer 22a. The polyimide layers 23 sandwiching the light-receiving region 22 therebetween to thereby reduce a capacity of a bonding region.

In the illustrated waveguide type light-receiving device, a light is introduced into the device through an end surface of the light-receiving region 22, and is transferred and absorbed in the n-InGaAs light-absorbing layer 22b and the p-InGaAs light-absorbing layer 22c both vertically sandwiched between the clad layers 22d and 22a.

Carriers generated due to absorption of a light are transferred to an external circuit (not illustrated) through the p-InGaAsP clad layer 22d, p-InGaAsP contact layer 22e, and p-side electrode 24. Since absorption of a light is accomplished in a length-wise direction of the light-receiving region 22, it is possible to obtain high quantum efficiency. In addition, since carriers run perpendicularly to the light-receiving region 22, running time of carriers is dependent only on a thickness of the n-InGaAs light absorbing layer 22b.

The above mentioned waveguide type light-receiving device has a problem as follows. If the n-InGaAs light absorbing layer 22b is formed thinner for reducing carriers running time, optical coupling efficiency would be deteriorated because a light introduced into the device through an optical fiber has a greater diameter than a thickness of the n-InGaAs light absorbing layer 22b. In contrast, if the n-InGaAs light absorbing layer 22b is formed thicker for enhancing optical coupling efficiency, it would be accompanied with an increase in running time of carriers.

Figure 2A:
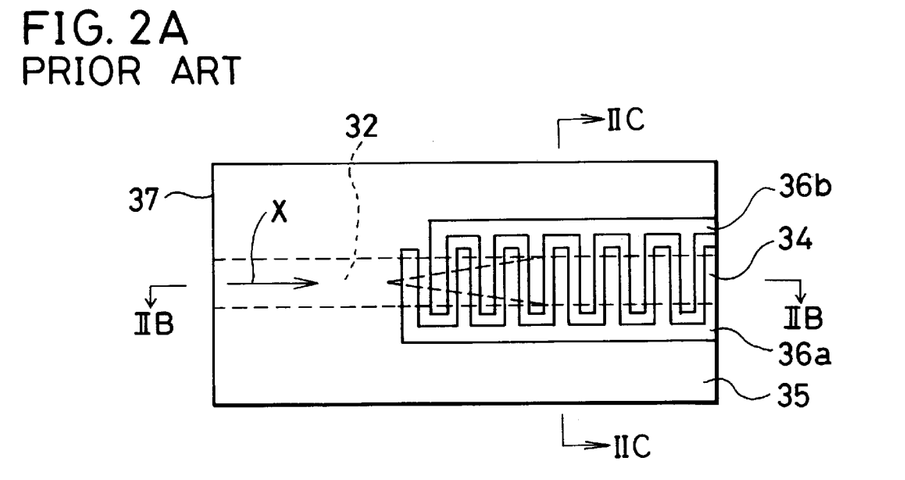
FIG. 2A is a top plan view illustrating another conventional semiconductor light-receiving device.
Figure 2B:
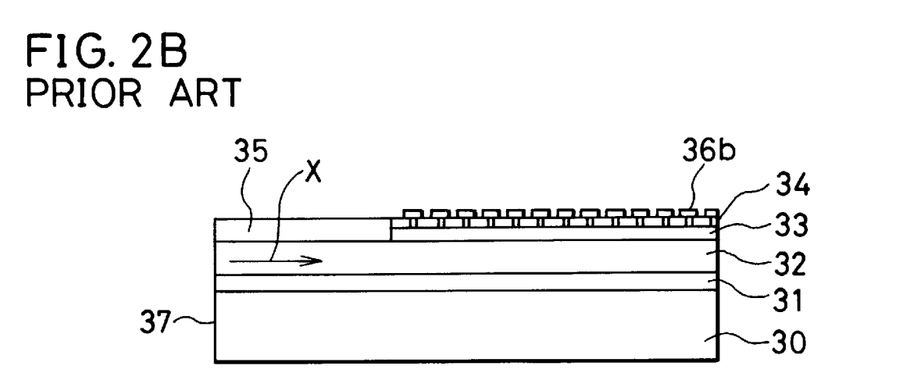
FIG. 2B is a cross-sectional view taken along the line IIB—IIB in FIG. 2A.
Figure 2C:
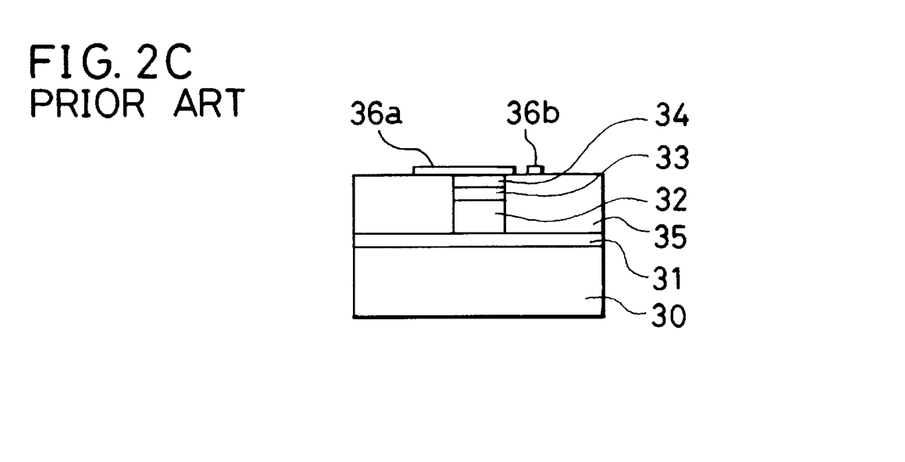
FIG. 2C is a cross-sectional view taken along the line IIC—IIC in FIG. 2A.

FIGS. 2A to 2C illustrate another semiconductor waveguide light-receiving device suggested in Japanese Unexamined Patent Publication No. 3-35555. FIG. 2A is a top plan view of the device, FIG. 2B is a cross-sectional view of the device taken along the line IIB—IIB in FIG. 2A, and FIG. 2C is a cross-sectional view of the device taken along the line IIC—IIC in FIG. 2A.

The illustrated semiconductor waveguide light-receiving device includes a semiconductor substrate 30, a buffer layer 31 formed on the substrate 30, a waveguide 32 formed partially on the buffer layer 31, a light-receiving layer 33, and a junction forming layer 34. The waveguide 32, the light-receiving layer 33, and the junction forming layer 34 are sandwiched by fillers 35. The light-receiving layer 33 and the junction forming layer 34 cooperate with each other to form a light-receiving device, and are formed tapered in a direction indicated with an arrow X in which a light is directed. On the junction forming layer 34 are alternately formed p-type regions 36a and n-type regions 36b arranged in a direction indicated with the arrow X.

A light is introduced into the device through an end surface 37 thereof, and is transferred through the waveguide 33 in a direction indicated with the arrow X.

Figure 3:
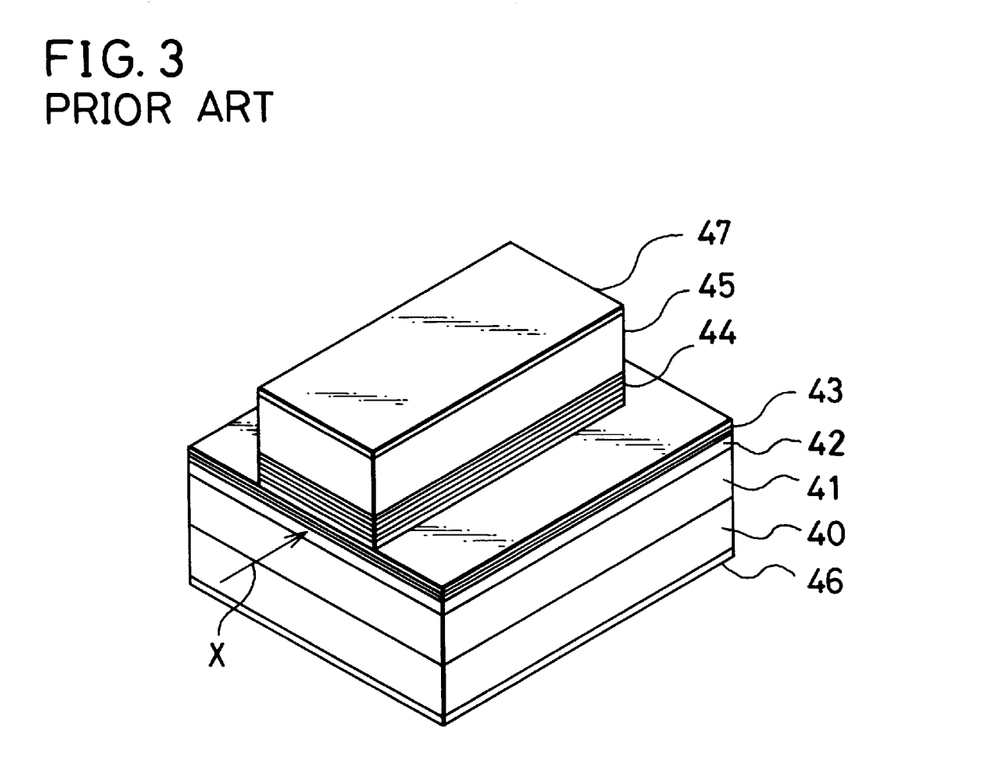
FIG. 3 is a perspective view illustrating still another conventional semiconductor light-receiving device.

FIG. 3 illustrates still another semiconductor waveguide light-receiving device suggested in Japanese Unexamined Patent Publication No. 4-268770.

The illustrated device includes an InP substrate 40, an InGaAsP clad layer 41 formed on the substrate 40, an InGaAsP core layer 42 formed on the InGaAsP clad layer 41, clad layers 43 and 44 both made of an InGaAsP multi-layered structure formed on the InGaAsP core layer 42, an InGaAsP layer 45 formed on the InGaAsP core layer 42, an n-side electrode 46 formed on a lower surface of the substrate 40, and a p-side electrode 47 formed on an upper surface of the InGaAsP layer 45. The multi-layered structure 43 and 44 are formed by alternately depositing layers for absorbing a light thereinto and layers transparent to a light. The multi-layered structure 44 is formed partially on the multi-layered structure 43 in the form of a ridge.

The multi-layered structures 43 and 44 act as a light-absorber. A light is introduced into the device through a side surface thereof in a direction indicated with an arrow X, and is converted into electricity in the multi-layered structures 43 and 44.

In both of the above mentioned waveguide light-receiving devices, a light is introduced into the devices through end surfaces thereof. However, the devices have a problem that optical coupling efficiency is quite low. In the above mentioned conventional waveguide light-receiving devices, if an n-InGaAs light-receiving layer is formed thinner for reducing running time of carriers, optical coupling efficiency would be deteriorated because an incident light has a sufficiently greater diameter than a thickness of the n-InGaAs light-receiving layer. In contrast, if an n-InGaAs light-receiving layer were formed thicker for enhancing optical coupling efficiency, running time of carriers would be increased. Thus, the above mentioned waveguide light-receiving devices could not improve optical coupling efficiency.

SUMMARY OF THE INVENTION

It is an object of the present invention to provide a semiconductor light-receiving device which is capable of efficiently receiving a light thereinto in high optical coupling efficiency, and a method of fabricating the same.

In one aspect, there is provided a semiconductor light-receiving device including (a) a semiconductor substrate, and (b) a multi-layered structure including: a first semiconductor layer having a first electrical conductivity and lying on the semiconductor substrate; a second semiconductor substrate having a first electrical conductivity and lying on the first semiconductor layer; and a third semiconductor layer having a second electrical conductivity and lying on the second semiconductor layer. The multi-layered structure has at least one portion which is inclined to a direction in which a light introduced into the device is directed.

In a preferred embodiment, the multi-layered structure has end portions which are inclined to the direction. It is preferred that the multi-layered structure is embedded in the semiconductor substrate so that the multi-layered structure is formed tapered at end portions thereof.

The multi-layered structure may have continuously formed three portions: a first portion inclined to the direction; a second portion extending in parallel with the direction; a third portion inclined to the direction. For instance, the first and third portions may have the same degree by which the first and third portions are inclined.

It is preferable that band gap energies E1, E2 and E3 of the first, second and third semiconductor layers, respectively, have a relation defined as E1>E2>E3.

There is further provided a semiconductor light-receiving device including (a) a semiconductor substrate, (b) a multi-layered structure having a first buffer layer having a first electrical conductivity and lying on the semiconductor substrate, a first clad layer having a first electrical conductivity and lying on the first buffer layer, a light-absorbing layer having a first electrical conductivity and lying on the first clad layer; a second clad layer having a second electrical conductivity and lying on the light-absorbing layer, and a second buffer layer having a second electrical conductivity and lying on the second clad layer, (c) a first electrode formed on the second buffer layer, and (d) a second electrode formed on a lower surface of the semiconductor substrate. The multi-layered structure has at least one portion which is inclined to a direction in which a light introduced into the device is directed.

It is preferable that the semiconductor substrate is made of InP, the first and second buffer layers are made of InP, the first and second clad layers are made of InGaAsP, and the light-absorbing layer is made of InGaAs.

The light-absorbing layer has a thickness preferably in the range of 0.7 µm and 1.3 µm both inclusive, and more preferably of 1.0 µm.

It is preferable that the semiconductor light-receiving device further includes an insulating layer disposed adjacent to and in level with the multi-layered structure; and a bonding electrode formed on an upper surface of the insulating layer and in electrical connection with the first electrode, in which case, it is preferable that the semiconductor substrate has an exposed region at the opposite side of the insulating layer with respect to the multi-layered structure, a lowermost layer of the multi-layered structure having a portion extending over the exposed region.

There is still further provided a semiconductor light-receiving device including (a) a semiconductor substrate, and (b) a layered waveguide formed on the semiconductor substrate, the waveguide having a portion making inclination with a side plane of the semiconductor substrate through which a light is introduced into the semiconductor light-receiving device.

It is preferable that the portion is opposite end portions of the waveguide, and that the waveguide is embedded in the semiconductor substrate.

In another aspect, there is provided a method of fabricating a semiconductor light-receiving device, including the steps of (a) forming a recess in a semiconductor substrate by wet etching, and (b) forming a layered waveguide in the recess by epitaxial growth.

There is further provided a method of fabricating a semiconductor light-receiving device, including the steps of (a) forming a recess in a semiconductor substrate so that the recess has inclined surfaces, (b) forming a multi-layered structure in the recess so that the multi-layered structure fills the recess, the multi-layered structure including a plurality of semiconductor layers, (c) etching a portion of the multi-layered structure longitudinally thereof until the semiconductor substrate appears, (d) forming an insulating layer in a region etched in the step (c) so that the insulating layer is level with the multi-layered structure, (e) forming a contact electrode on the multi-layered structure, (f) forming a bonding electrode on the insulating layer so that the bonding electrode is in electrical connection with the contact electrode, and (g) forming an electrode on a lower surface of the semiconductor substrate.

A semi-insulating substrate may be employed in place of the semiconductor substrate in the step (a). It is preferable that the recess is formed by wet etching in the step (a).

The multi-layered structure may include a first buffer layer having a first electrical conductivity; a first clad layer having a first electrical conductivity and lying on the first buffer layer, a light-absorbing layer having a first electrical conductivity and lying on the first clad layer, a second clad layer having a second electrical conductivity and lying on the light-absorbing layer, and a second buffer layer having a second electrical conductivity and lying on the second clad layer. It is also preferable that the semiconductor substrate is made of InP, the first and second buffer layers are made of InP, the first and second clad layers are made of InGaAsP, and the light-absorbing layer is made of InGaAs.

The method may further include the step (h) of forming a film over a resultant for protecting a surface thereof, the contact electrode being formed in a hole of the film. The step (h) is to be carried out between the steps (d) and (e).

It is preferable that the multi-layered structure is etched in the step (c) so that a longitudinal portion thereof is removed at one side until the semiconductor substrate appears and a longitudinal portion thereof is removed at the opposite side until the first buffer layer appears.

The advantages obtained by the aforementioned present invention will be described hereinbelow.

The first advantage is that a semiconductor light-receiving device in accordance with the present invention can be readily coupled to an optical fiber with high coupling efficiency greater than 90%.

This is because that the waveguide or multi-layered structure is formed to have at least one portion which is inclined to a direction in which a light introduced into the device is directed, which provides the same effect as that a cross-sectional or light-receiving area of the n-InGaAs light-receiving layer is increased as viewed from a plane through which a light is introduced into the device.

The second advantage is that it is possible to obtain high quantum efficiency greater than 90%.

The reason is as follows. A semiconductor light-receiving device in accordance with the present invention may have continuously formed three portions by forming inclined portions in the device: a first portion inclined to a direction in which an incident light run in the device; a second portion extending in parallel with the direction; a third direction inclined to the direction. Thus, when viewed from a plane of the device through which a light is introduced into the device, it is possible to have the same effect as that a thickness of the n-InGaAs light-receiving layer is increased.

The third advantage is that it is possible to accomplish high-speed response beyond 20 Gbps.

This is because that it is possible to reduce running time of carriers by forming an n-InGaAs light-receiving layer to have a thickness of 1 $\mu$m.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 4:
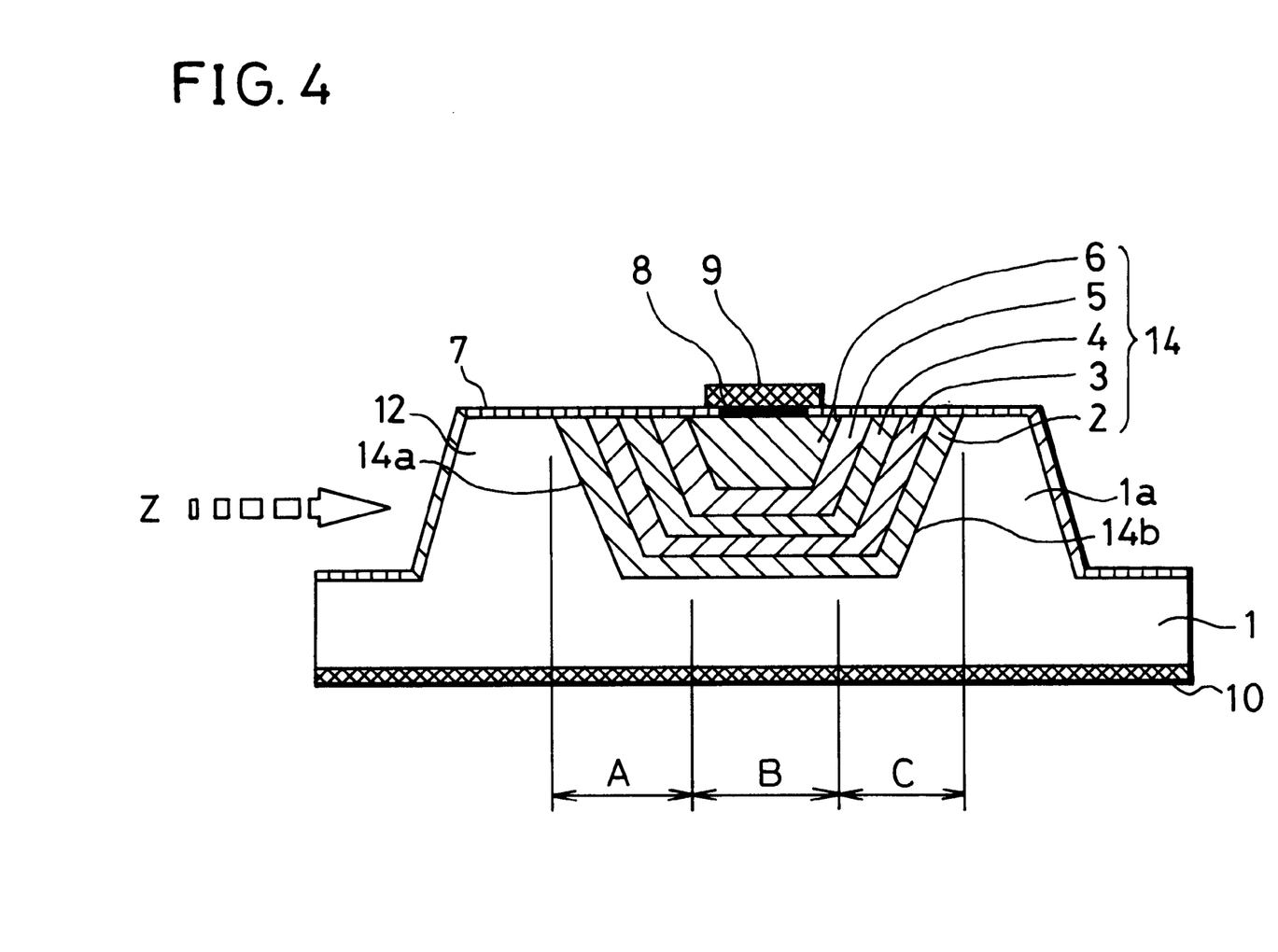
FIG. 4 is a cross-sectional view illustrating a semiconductor light-receiving device in accordance with the first embodiment of the present invention.
Figure 5:
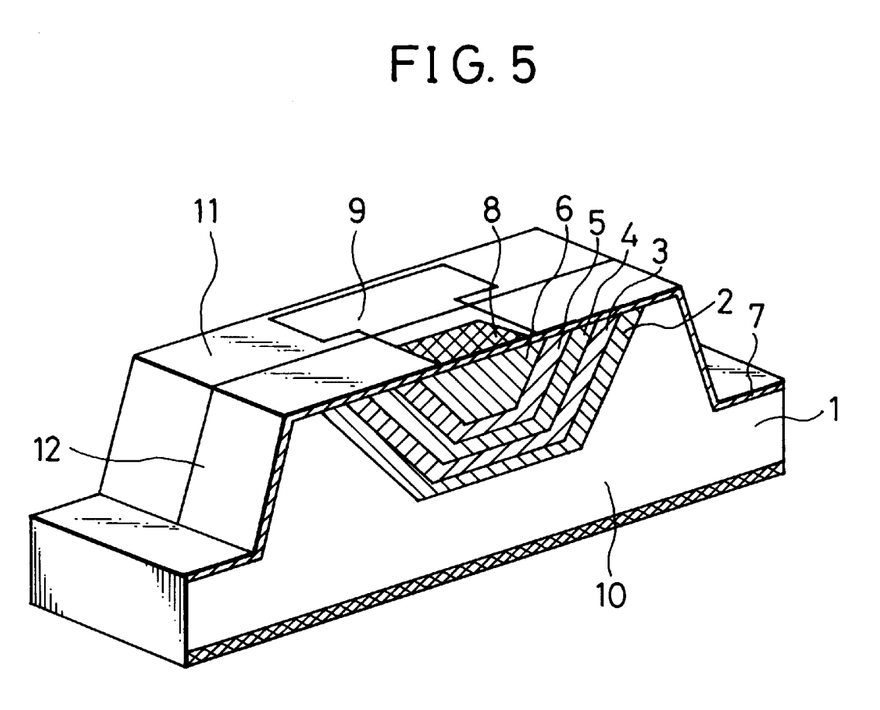
FIG. 5 is a perspective view of the device illustrating in FIG. 4.

FIGS. 4 and 5 illustrate a semiconductor light-receiving device in accordance with the first embodiment of the present invention.

As illustrated in FIG. 4, a semiconductor light-receiving device in accordance with the first embodiment includes an n-InP substrate 1 having a trapezoid-shaped, raised portion 1a, a multi-layered structure 14 embedded in the trapezoid-shaped, raised portion 1a, a SiNx film 7 covering an upper surface of the n-InP substrate 1 therewith, a p-side contact electrode 8 formed on an uppermost layer of the multi-layered structure 14, and n-side electrode 10 formed on a lower surface of the n-InP substrate 1.

As illustrated in FIG. 5, there is formed a polyimide layer 11 having the same reverse trapezoidal cross-section as the multi-layered structure 14, adjacent to and making close contact with the trapezoid-shaped, raised portion 1a. The polyimide layer 11 is in level with the trapezoid-shaped, raise portion 1a. On an upper surface of the polyimide layer 11 is formed a p-side electrode 9, which extends towards the trapezoid-shaped, raised portion 1a to cover and make electrical contact with the p-side contact electrode 8.

The trapezoid-shaped, raised portion 1a has inclined end surfaces. A signal light Z is introduced into the semiconductor light-receiving device through one of the end surfaces, which is hereinafter referred to as a light-receiving plane 12.

The multi-layered structure 14 acts as a waveguide, and is comprised of an n-InP layer 2 as a first buffer layer, an n-InGaAsP clad layer as a first clad layer 3, an n-InGaAs light-absorbing layer 4, a p-InGaAsP clad layer as a second clad layer 5, and a p-InP layer 6 as a second buffer layer 6, which layers are deposited in this order on the n-InP substrate 1.

The n-InGaAs light-absorbing layer 4 is designed to have a thickness of 1 $\mu$m.

As illustrated in FIGS. 4 and 5, the multi-layered structure 14 is a reverse trapezoid in shape, and hence end surfaces 14a and 14b inclined to a direction in which the signal light Z runs in the device. The inclined end surfaces 14a and 14b have the same inclination angle of about 56 degrees. However, it should be noted that the end surfaces 14a and 14b may be designed to have different inclination angles.

Since the multi-layered structure 14 is reverse trapezoid-shaped, the multi-layered structure 14 may be considered to have continuously formed three portions: a first portion A including the inclined end surface; a second portion B extending in parallel with a direction in which the signal light Z runs in the multi-layered structure 14; a third portion C including the inclined end surface 14b.

Figure 6A:
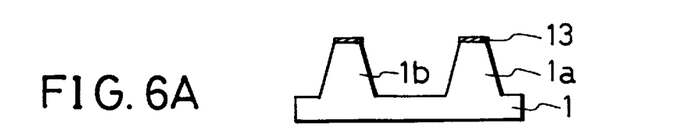
FIGS. 6A to 6H are cross-sectional views of a semiconductor light-receiving device in accordance with the first embodiment, illustrating respective steps of a method of fabricating the same.

FIGS. 6A to 6H illustrate respective steps of a method of fabricating the above mentioned semiconductor light-receiving device illustrated in FIGS. 4 and 5. First, as illustrated in FIG. 6A, on an n-InP semiconductor substrate or a semi-insulating substrate 1 having a trapezoid-shaped, raised portion 1a is formed an etching mask 13 having a width of 5 μm and a space of 30 μm, and made of, for instance, photoresist. Then, wet etching is carried out to thereby form a reverse trapezoid-shaped recess in the trapezoid-shaped, raised portion 1a. The recess has an upper width of 30 μm and a depth of 10 μm, and hence has inclined sidewalls 1b. In the wet etching, the substrate 1 is etched so that an etching angle is kept uniformly about 56 degrees due to crystal lattice.

Figure 6B:
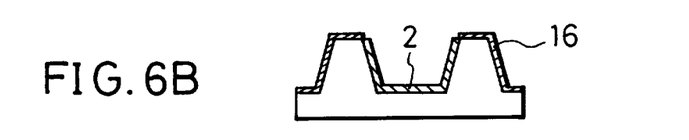
Figure 6C:
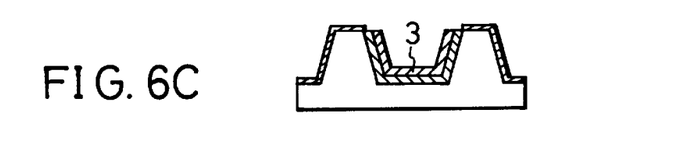
Figure 6D:
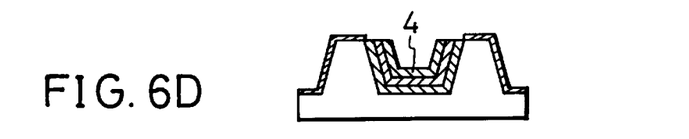
Figure 6E:
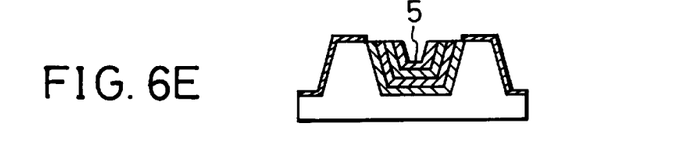

Then, as illustrated in FIG. 6B, there are formed oxide films 16 both on an upper surface of the reverse trapezoid-shaped portion 1a which is not to be etched, and on outer surface of the substrate 1. The oxide mask 16 will prevent crystal growth thereon.

Figure 6F:
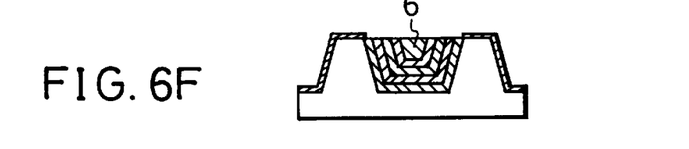

Then, the multi-layered structure 14 is formed in the reverse trapezoid-shaped recess by chemical vapor deposition (CVD). There are successively deposited the n-InP buffer layer 2 having a carrier concentration of 1×15 cm$^{-3}$ and a thickness of 0.5 μm (FIG. 6B), the n-InGaAsP clad layer 3 having a carrier concentration of 1×15 cm$^{-3}$ and a thickness of 0.5 μm (FIG. 6C), the n-InGaAs light-absorbing layer 4 having a carrier concentration of 1×15 cm$^{-3}$ and a thickness of 1 μm (FIG. 6D), the p-InGaAsP clad layer 5 having a carrier concentration of 1×15 cm$^{-3}$, a thickness of 0.5 μm and a band gap energy of 1.08 eV (FIG. 6E), and the p-InP layer 6 having a carrier concentration of 1×18 cm$^{-3}$ (FIG. 6F). The p-InP layer 6 is deposited in such a manner that it completely fills the recess and forms a flat upper surface of the multi-layered structure 14, as illustrated in FIG. 6F.

Herein, the layers 2, 3, 4, 5 and 6 are designed to have particular dimensions such as a carrier concentration and a thickness, however it should be noted that they may be designed to have other dimensions. Specifically, the layers 2 to 5 may be designed to have a carrier concentration equal to or smaller than 2×15 cm$^{-3}$ and a thickness in the range of 1 to 2 μm both inclusive.

Then, a resultant is etched, for instance, by reactive ion beam etching (RIBE) until the n-InP substrate 1 appears, leaving a 10 μm-width stripe-shaped region not to be etched, as illustrated in FIG. 5. Then, the polyimide layer 11 is formed on the thus etched region so that the polyimide layer 11 has the same height as that of the reverse trapezoid-shaped, raised portion 1a of the substrate 1.

Figure 6G:
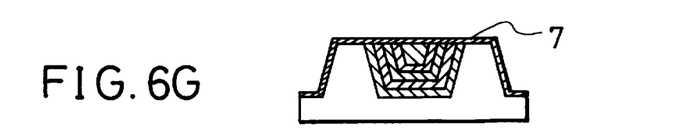

Then, as illustrated in FIG. 6G, there is formed a SiNx film 7 over a resultant, for instance, by plasma-enhanced chemical vapor deposition (PCVD). The SiNx film 7 protects a surface of the device. Then, a through hole is formed throughout a thickness of the SiNx film 7 on the p-InP layer 6, and the p-side contact electrode 8 is formed in the through hole. Then, the bonding p-side electrode 9 is formed on an upper surface of the polyimide layer 11 so that the bonding electrode 9 extends to and makes electrical contact with the contact electrode 8.

Figure 6H:
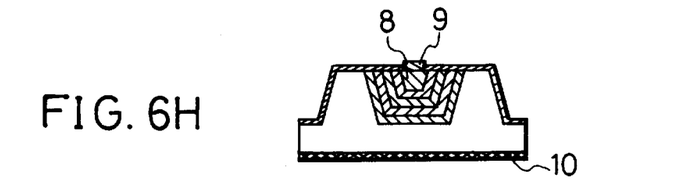

Then, the n-side electrode 10 is formed on a lower surface of the n-InP substrate 1. Thus, there is completed the semiconductor light-receiving device in accordance with the first embodiment.

When a light is introduced into the above mentioned semiconductor light-receiving device through the light-receiving plane 12, a light is absorbed by about 60% by the n-InGaAs light absorbing layer 4 in the first portion A of the multi-layered structure 14. Then, a light having passed the first portion A without being absorbed thereinto is absorbed in the n-InGaAsP clad layer 3, the n-InGaAs light absorbing layer 4 and the p-InGaAsP clad layer 5 in the second portion B of the multi-layered structure 14. A light having passed the first and second portions A and B without being absorbed thereinto is introduced into and absorbed in the third portion C of the multi-layered structure 14. A light having been absorbed into the first, second and/or third portions A, B and/or C is converted to electricity in the n-InGaAs layer 4 to thereby generate carriers. An electric field applied to the p-side and n-side electrodes 9 and 10 leads the thus generated carriers to an external circuit (not illustrated) through the p-InGaAsP clad layer 5, the p-InP layer 6 and the p-side electrode 9.

As a result, suppose that the n-InGaAsP clad layer 3, n-InGaAs light absorbing layer 4, and p-InGaAsP clad layer 5 have band gap energies E1, E2 and E3, respectively, the band gap energies have a relation defined as E1>E2>E3.

As mentioned so far, in accordance with the first embodiment, the multi-layered structure 14 or the waveguide is designed to have inclined end portions. Thus, it is possible to have the same advantageous effect as that a thickness of the n-InGaAs light absorbing layer 4 as viewed from the light-receiving plane 12 is made thicker. As a result, the light-receiving device could be readily coupled to an optical fiber through the end surface or light-receiving plane, and it would be possible to have high optical coupling efficiency greater than 90% and high quantum efficiency greater than 90%. In addition, it would be possible to make a response at a speed greater than 20 Gbps by designing the n-InGaAs light absorbing layer 4 to have a thickness in the range of 0.7 μm and 1.3 μm both inclusive, preferably a thickness of 1.0 μm. If the thickness is smaller than 0.7 μm, the coupling efficiency is too much reduced, and if the thickness is greater than 1.3 μm, running time of carriers is too much increased.

In the above mentioned first embodiment, the multi-layered structure 14 is fabricated by chemical vapor deposition. It should be noted that the multi-layered structure 14 might be fabricated by liquid deposition, MOCVD, MBE or ALE.

Figure 7:
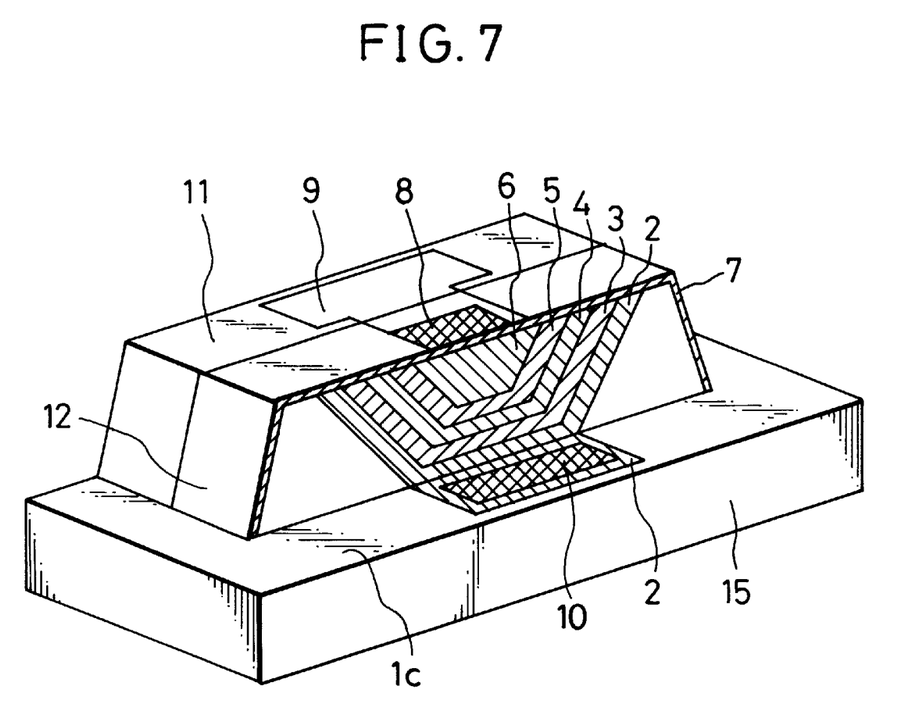
FIG. 7 is a cross-sectional view illustrating a semiconductor light-receiving device in accordance with the second embodiment of the present invention.

FIG. 7 illustrates a semiconductor light-receiving device in accordance with the second embodiment of the present invention, which is different from the semiconductor light-receiving device in accordance with the first embodiment illustrated in FIGS. 4 and 5 in that the n-InP substrate 1 in the second embodiment has an exposed region 1c at the opposite side of the insulating layer 11 with respect to the multi-layered structure 14. Namely, the exposed region 1c of the substrate 1 is located adjacent to the multi-layered structure 14. A part of the n-InP layer 2 extends over the exposed region 1c. The other structure of the semiconductor light-receiving device in accordance with the second embodiment is the same as that of the semiconductor light-receiving device in accordance with the first embodiment.

A method of fabricating a semiconductor light-receiving device in accordance with the second embodiment is explained hereinbelow with reference to FIGS. 6A to 6H. Though the FIGS. 6A to 6H are drawings for explaining the method of fabricating the semiconductor light-receiving device in accordance with the first embodiment, a method mentioned later has a lot of common steps as the method illustrated in FIGS. 6A to 6H, and hence FIGS. 6A to 6H are referred to again.

First, as illustrated in FIG. 6A, on a semi-insulating InP substrate 15 having a trapezoid-shaped, raised portion 1a is formed an etching mask 13 having a width of 5 μm and a space of 30 μm, and made of photoresist. Then, wet etching is carried out to thereby form a reverse trapezoid-shaped recess in the trapezoid-shaped, raised portion 1a. The recess has an upper width of 30 μm and a depth of 10 μm, and hence has inclined sidewalls 1b. In the wet etching, the substrate 15 is etched so that an etching angle is kept uniformly about 56 degrees due to crystal lattice.

Then, as illustrated in FIG. 6B, there are formed oxide films 16 both on an upper surface of the reverse trapezoid-shaped portion 1a which is not to be etched, and on outer surface of the substrate 15. The oxide mask 16 will prevent crystal growth thereon.

Then, the multi-layered structure 14 is formed in the reverse trapezoid-shaped recess by CVD. There are successively deposited the n-InP buffer layer 2 having a carrier concentration of $1 \times 15$ cm$^{-3}$ and a thickness of 0.5 μm (FIG. 6B), the n-InGaAsP clad layer 3 having a carrier concentration of $1 \times 15$ cm$^{-3}$ and a thickness of 0.5 μm (FIG. 6C), the n-InGaAs light-absorbing layer 4 having a carrier concentration of $1 \times 15$ cm$^{-3}$ and a thickness of 1 μm (FIG. 6D), the p-InGaAsP clad layer 5 having a carrier concentration of $1 \times 15$ cm$^{-3}$, a thickness of 0.5 μm and a band gap energy of 1.08 eV (FIG. 6E), and the p-InP layer 6 having a carrier concentration of $1 \times 18$ cm$^{-3}$ (FIG. 6F). The p-InP layer 6 is deposited in such a manner that it completely fills the recess and forms a flat upper surface of the multi-layered structure 14, as illustrated in FIG. 6F.

Then, a resultant is etched by RIBE at one side with respect to the multi-layered structure 14 until the semi-insulating InP substrate 15 appears, and at the other side until the n-InP layer 2 appears, leaving a 10 μm-width stripe-shaped region of the multi-layered structure 14 not to be etched, as illustrated in FIG. 7. Then, the polyimide layer 11 is formed on the thus etched region in which the substrate 15 appears so that the polyimide layer 11 has the same height as that of the reverse trapezoid-shaped, raised portion 1a of the substrate 15.

Then, as illustrated in FIG. 6G, there is formed a SiNx film 7 over a resultant by PCVD. The SiNx film 7 protects a surface of the device. Then, a through hole is formed throughout a thickness of the SiNx film 7 on the p-InP layer 6, and the p-side contact electrode 8 is formed in the through hole. Then, the bonding p-side electrode 9 is formed on an upper surface of the polyimide layer 11 so that the bonding electrode 9 extends to and makes electrical contact with the contact electrode 8.

Then, the n-side electrode 10 is formed on a lower surface of the substrate 15. Thus, there is completed the semiconductor light-receiving device in accordance with the second embodiment.

When a light is introduced into the above mentioned semiconductor light-receiving device through the light-receiving plane 12, a light is absorbed by about 60% by the n-InGaAs light absorbing layer 4 in the first portion A of the multi-layered structure 14. Then, a light having passed the first portion A without being absorbed thereinto is absorbed in the n-InGaAsP clad layer 3, the n-InGaAs light absorbing layer 4 and the p-InGaAsP clad layer 5 in the second portion B of the multi-layered structure 14. A light having passed the first and second portions A and B without being absorbed thereinto is introduced into and absorbed in the third portion C of the multi-layered structure 14. A light having been absorbed into the first, second and/or third portions A, B and/or C is converted to electricity in the n-InGaAs layer 4 to thereby generate carriers. An electric field applied to the p-side and n-side electrodes 9 and 10 leads the thus generated carriers to an external circuit (not illustrated) through the p-InGaAsP clad layer 5, the p-InP layer 6 and the p-side electrode 9.

As mentioned so far, in accordance with the second embodiment, the multi-layered structure 14 or the waveguide is designed to have inclined end portions, similarly to the first embodiment. Thus, it is possible to have the same advantageous effect as that a thickness of the n-InGaAs light absorbing layer 4 as viewed from the light-receiving plane 12 is made thicker. As a result, the light-receiving device could be readily coupled to an optical fiber through the end surface or light-receiving plane, and it would be possible to have high optical coupling efficiency greater than 90% and high quantum efficiency greater than 90%. In addition, it would be possible to make a response at a speed greater than 20 Gbps by designing the n-InGaAs light absorbing layer 4 to have a thickness of $1.0 \pm 0.3$ μm.

Similarly to the first embodiment, the multi-layered structure 14 may be fabricated by liquid deposition, CVD, MOCVD, MBE or ALE.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-169736 filed on Jun. 28, 1996 including specification, claims, drawings and summary is incorporated herein by reference in its entirety.

What is claimed is:

1. A semiconductor light-receiving device comprising:
   (a) a semiconductor substrate; and
   (b) a multi-layered structure comprising: a first semiconductor layer having a first electrical conductivity type and lying on a portion of said semiconductor substrate; a second semiconductor layer having said first electrical conductivity type and lying on said first semiconductor layer; and a third semiconductor layer having a second electrical conductivity type and lying on said second semiconductor layer,
   said first semiconductor layer comprising at least a first planar region with a thickness and a length, the length being substantially greater than the thickness, said first planar region being non-orthogonally inclined to a direction in which a light introduced into said device is directed, and a second planar region aligned with the direction in which the light is introduced.

2. The semiconductor light-receiving device as set forth in claim 1, wherein said multi-layered structure has end portions which are inclined to said direction.

3. The semiconductor light-receiving device of claim 2, wherein said end portions further comprise end surfaces which are co-planar.

4. The semiconductor light-receiving device of claim 3, wherein said end surfaces are aligned with said direction.

5. The semiconductor light-receiving device as set forth in claim 1, wherein said multi-layered structure is embedded in said semiconductor substrate so that said multi-layered structure is formed tapered at end portions thereof.

6. The semiconductor light-receiving device as set forth in claim 1, wherein said multi-layered structure has continuously formed three portions: a first portion inclined to said direction; a second portion extending in parallel with said direction; and a third direction inclined to said direction.

7. The semiconductor light-receiving device as set forth in claim 6, wherein said first and third portions have the same degree by which said first and third portions are inclined.

8. The semiconductor light-receiving device as set forth in claim 1, wherein band gap energies E1, E2 and E3 of said first, second and third semiconductor layers, respectively, have a relation defined as E1>E2>E3.

9. The semiconductor light-receiving device of claim 1, further comprising a planar end face surface.

10. The semiconductor light-receiving device of claim 9, wherein said planar end face surface is aligned with said direction.

11. A semiconductor light-receiving device comprising:
   (a) a semiconductor substrate;
   (b) a multi-layered structure including: a first buffer layer having a first electrical conductivity type and lying on a portion of said semiconductor substrate; a first clad layer having said first electrical conductivity type and lying on said first buffer layer; a light-absorbing layer having said first electrical conductivity type and lying on said first clad layer; a second clad layer having a second electrical conductivity type and lying on said light-absorbing layer; and a second buffer layer having said second electrical conductivity type and lying on said second clad layer;
   (c) a first electrode formed on said second buffer layer; and
   (d) a second electrode formed on a lower surface of said semiconductor substrate,
   said buffer layer comprising at least a first planar region with a thickness and a length, the length being substantially greater than the thickness, said first planar region being non-orthogonally inclined to a direction in which a light introduced into said device is directed, and a second planar region aligned with the direction in which the light is introduced.

12. The semiconductor light-receiving device as set forth in claim 11, wherein said multi-layered structure is embedded in said semiconductor substrate so that said multi-layered structure is formed tapered at end portions thereof.

13. The semiconductor light-receiving device as set forth in claim 11, wherein said multi-layered structure has continuously formed three portions: a first portion inclined to said direction; a second portion extending in parallel with said direction; and a third portion inclined to said direction.

14. The semiconductor light-receiving device as set forth in claim 13, wherein said first and third portions have the same degree by which said first and third portions are inclined.

15. The semiconductor light-receiving device as set forth in claim 11, wherein said semiconductor substrate is made of InP, said first and second buffer layers are made of InP, said first and second clad layers are made of InGaAsP, and said light-absorbing layer is made of InGaAs.

16. The semiconductor light-receiving device as set forth in claim 11, wherein said light-absorbing layer has a thickness in the range of 0.7 $\mu$m to 1.3 $\mu$m both inclusive.

17. The semiconductor light-receiving device as set forth in claim 16, wherein said light-absorbing layer has a thickness of 1.0 $\mu$m.

18. The semiconductor light-receiving device as set forth in claim 11, wherein band gap energies E1, E2 and E3 of said first clad layer, light-receiving layer and second clad layers, respectively, have a relation defined as E1>E2>E3.

19. The semiconductor light-receiving device as set forth in claim 11, further comprising: an insulating layer disposed adjacent to and in level with said multi-layered structure; and a bonding electrode formed on an upper surface of said insulating layer and in electrical connection with said first electrode.

20. The semiconductor light-receiving device as set forth in claim 19, wherein said semiconductor substrate has an exposed region at the opposite side of said insulating layer with respect to said multi-layered structure, a lowermost layer of said multi-layered structure having a portion extending over said exposed region.

21. A semiconductor light-receiving device comprising:
   (a) a semiconductor substrate; and
   (b) a layered waveguide formed on a surface portion of said semiconductor substrate, said waveguide having at least a first planar portion, said planar portion comprising a semiconductor layer with a thickness and a length, the length being substantially greater than the thickness, said first planar portion making a non-orthogonal inclination with a side plane of said semiconductor substrate through which a light is introduced into said semiconductor light-receiving device, and a second planar region aligned with the direction in which the light is introduced.

22. The semiconductor light-receiving device as set forth in claim 21, wherein said portion is opposite end portions of said waveguide.

23. The semiconductor light-receiving device as set forth in claim 21, wherein said waveguide is embedded in said semiconductor substrate.

24. The semiconductor light-receiving device as set forth in claim 21, wherein said waveguide has continuously formed three portions: a first portion inclined to said plane; a second portion extending perpendicularly to said plane; and a third portion inclined to said plane.

25. The semiconductor light-receiving device as set forth in claim 24, wherein said first and third portions have the same degree by which said first and third portions are inclined.

* * * * *